(12) United States Patent
Frohberg et al.

(10) Patent No.: US 7,608,912 B2
(45) Date of Patent: Oct. 27, 2009

(54) TECHNIQUE FOR CREATING DIFFERENT MECHANICAL STRAIN IN DIFFERENT CPU REGIONS BY FORMING AN ETCH STOP LAYER HAVING DIFFERENTLY MODIFIED INTRINSIC STRESS

(75) Inventors: Kai Frohberg, Niederau (DE); Joerg Hohage, Dresden (DE); Thomas Werner, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 429 days.

(21) Appl. No.: 11/422,659

(22) Filed: Jun. 7, 2006

(65) Prior Publication Data

US 2007/0077773 A1    Apr. 5, 2007

(30) Foreign Application Priority Data

Sep. 30, 2005   (DE) ................. 10 2005 046 974

(51) Int. Cl.
   *H01L 23/58* (2006.01)
(52) U.S. Cl. ............... 257/632; 257/E27.108; 257/371; 257/369; 257/288
(58) Field of Classification Search ......... 438/758; 257/E21.633, 368
See application file for complete search history.

(56) References Cited

U.S. PATENT DOCUMENTS

| 6,573,172 | B1 * | 6/2003 | En et al. ............... 438/626 |
|---|---|---|---|
| 2002/0041000 | A1 | 4/2002 | Watanabe et al. ........ 257/31 |
| 2004/0029323 | A1 * | 2/2004 | Shimizu et al. ......... 438/142 |
| 2004/0075148 | A1 | 4/2004 | Kumagai et al. ......... 257/29 |
| 2005/0194596 | A1 * | 9/2005 | Chan et al. ............ 257/66 |
| 2005/0218455 | A1 * | 10/2005 | Maeda et al. .......... 257/368 |
| 2005/0263825 | A1 * | 12/2005 | Frohberg et al. ........ 257/369 |
| 2006/0099763 | A1 * | 5/2006 | Liu et al. ............. 438/299 |
| 2006/0189075 | A1 * | 8/2006 | Kanno ................. 438/257 |
| 2006/0226490 | A1 * | 10/2006 | Burnett et al. ......... 257/365 |
| 2007/0042579 | A1 * | 2/2007 | Runyon et al. ......... 438/520 |

* cited by examiner

*Primary Examiner*—Kiesha L. Rose
*Assistant Examiner*—Igwe U Anya
(74) *Attorney, Agent, or Firm*—Williams, Morgan & Amerson, P.C.

(57) ABSTRACT

The present invention provides a technique for reducing stress or stress gradients in highly sensitive device regions, such as cache areas, while still providing high transistor performance in logic areas by correspondingly providing contact etch stop layers with compressive and tensile stress for P-channel transistors and N-channel transistors in these logic areas. Consequently, a reduced failure rate may be obtained.

5 Claims, 14 Drawing Sheets

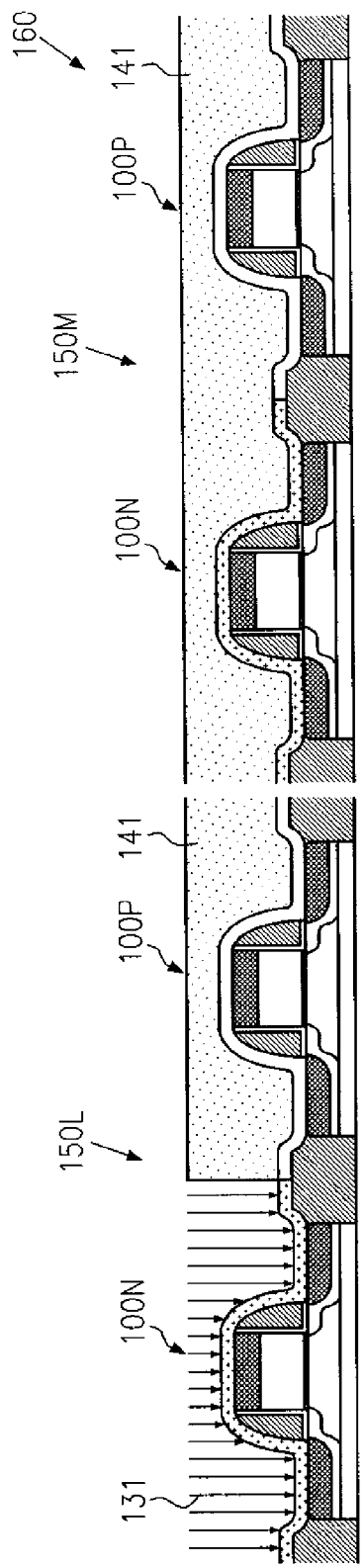
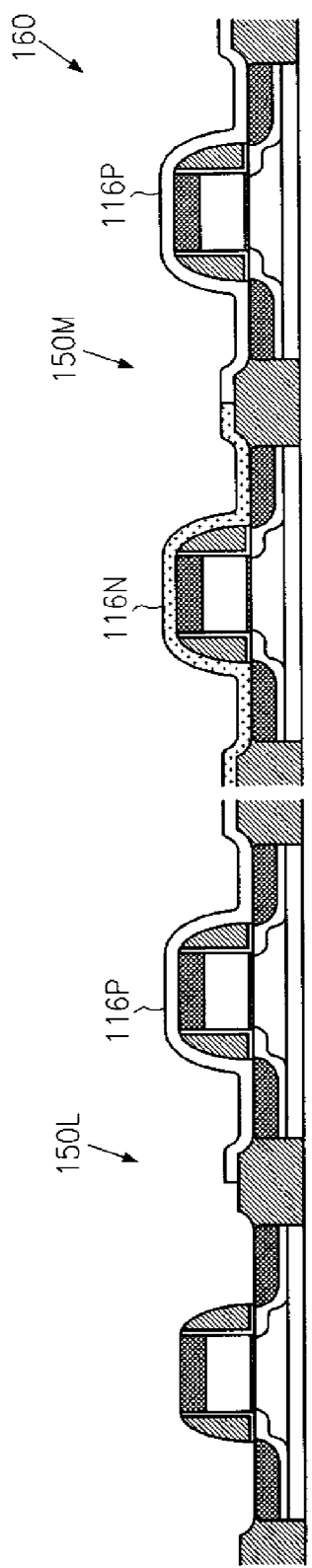
Fig.1e
Fig.1f

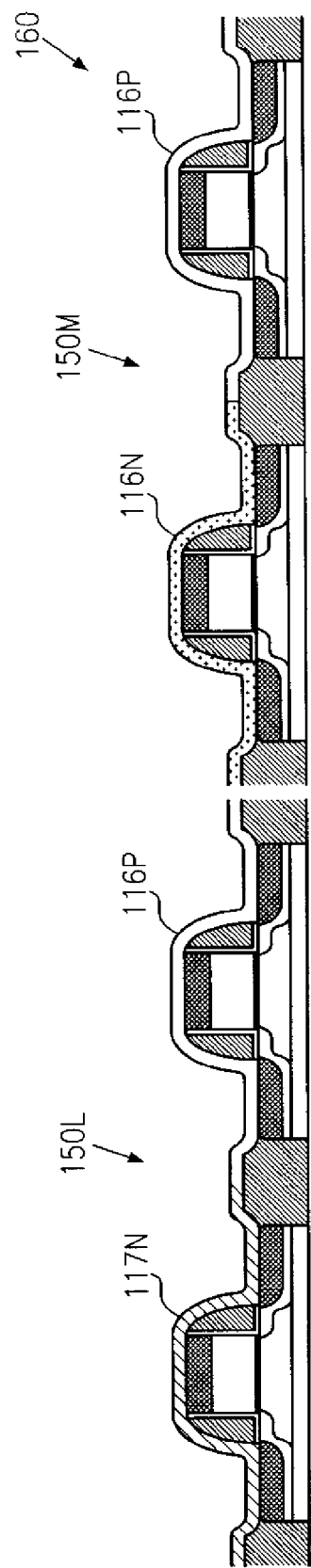

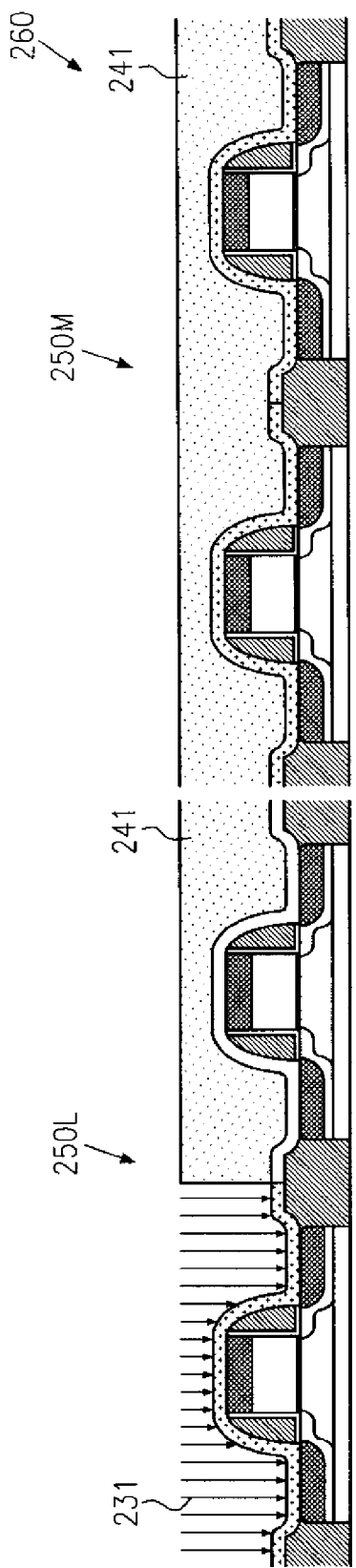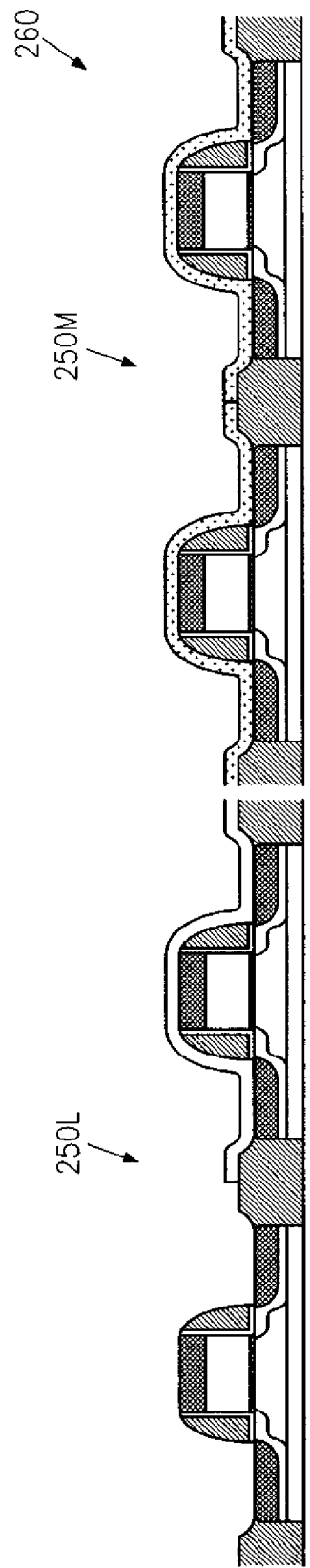

TECHNIQUE FOR CREATING DIFFERENT MECHANICAL STRAIN IN DIFFERENT CPU REGIONS BY FORMING AN ETCH STOP LAYER HAVING DIFFERENTLY MODIFIED INTRINSIC STRESS

BACKGROUND OF THE INVENTION

1. Field of the Invention

Generally, the present invention relates to the formation of integrated circuits, and, more particularly, to the formation of field effect transistors in complex circuits including a complex logic circuitry and a memory area, such as a cache memory of a CPU.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of process techniques concerning the above-identified complex process steps, it has been proposed to enhance device performance of the transistor elements not only by reducing the transistor dimensions but also by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive strain therein, which results in a modified mobility for electrons and holes, respectively. For example, creating tensile strain in the channel region may increase the mobility of electrons, which, in turn, may directly translate into a corresponding increase in the conductivity for N-type transistors. On the other hand, compressive strain in the channel region may increase the mobility of holes, thereby providing the potential for enhancing the performance of P-type transistors. Consequently, it has been proposed to introduce, for instance, a silicon/germanium layer or a silicon/carbon layer in or below the channel region to create tensile or compressive stress. Although the transistor performance may be considerably enhanced by the introduction of stress-creating layers in or below the channel region, significant efforts have to be made to implement the formation of corresponding strain-inducing layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Therefore, a technique is frequently used that enables the creation of desired stress conditions within the channel region of different transistor elements by individually modifying the stress characteristics of a contact etch stop layer that is formed after completion of the basic transistor structure in order to form contact openings to the gate and drain and source terminals in an interlayer dielectric material. Hereby, a reliable and precise control of mechanical stress induced in the transistor elements becomes more and more important to cope with effects such as nucleation of defects, void formation, modification of electrical behavior, and the like. The effective control of mechanical stress in the channel region, i.e., effective stress engineering, may be accomplished by individually adjusting the internal stress in the contact etch stop layer in order to position a contact etch stop layer having an internal compressive stress above a P-channel transistor while positioning a contact etch stop layer having an internal tensile stress above an N-channel transistor, thereby creating compressive and tensile strain, respectively in the respective channel regions.

Although this technique is highly efficient in individually enhancing the transistor performance of individual transistors, an increased failure probability and/or production yield may be observed in complex circuits comprising logic circuits and high density memory areas, such as static RAM (random access memory) cells, thereby rendering the above technique less desirable for the formation of highly advanced integrated circuits.

In view of the above-described situation, there exists a need for an alternative technique that enables the creation of desired stress conditions in the transistor structures while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that aims at reducing the failure probability in highly complex integrated circuits by reducing a significant difference in strain between transistors of different types within highly sensitive device regions. For this purpose, strain-inducing contact etch stop layers may be individually provided with a specific intrinsic stress to individually enhance performance of N-channel transistors and P-channel transistors in less sensitive device areas, such as logic functional blocks, while reducing gradients in strain or stress by providing a relaxed contact etch stop layer for both types of transistors within sensitive device areas, such as cache areas or other memory areas and device regions having a high integration density, or by providing a strain-generating mechanism for one type of transistors only.

According to one illustrative embodiment of the present invention, a method comprises forming a first dielectric layer having a first intrinsic mechanical stress over a first substrate region and a second substrate region, wherein the first substrate region comprises a first P-channel transistor and a first N-channel transistor and wherein the second substrate region comprises a second P-channel transistor and a second N-channel transistor. The method further comprises modifying the first intrinsic mechanical stress in the second P-channel transistor and/or the second N-channel transistor, while masking the first P-channel transistor and/or the first N-channel transistor in the first substrate region. Moreover, the method comprises selectively removing a portion of the first dielectric layer to expose the first P-channel transistor or the first N-channel transistor of the first substrate region. Moreover, a second dielectric layer having a second intrinsic mechanical stress is formed above the first substrate region and the second substrate region, wherein the second intrinsic stress differs from the first intrinsic stress. Finally, the second intrinsic stress is modified in the second substrate region and in the other one of the first P-channel transistor and N-channel transistor in the first substrate region.

According to another illustrative embodiment of the present, a semiconductor device comprises a first device region including a plurality of first P-channel transistors and N-channel transistors, which form a first functional block. The semiconductor device further comprises a second device region including a plurality of second P-channel transistors and N-channel transistors, which form a second functional block. The device further comprises a first dielectric contact etch stop layer formed in the first device region and comprising a plurality of first portions having a first intrinsic stress value and comprising a plurality of second portions having a second intrinsic stress value other than the first intrinsic stress value, wherein the first portions are formed above the P-channel transistors and the second portions are formed above the N-channel transistors. Moreover, the device comprises a second dielectric contact etch stop layer formed in the second device region and having a third intrinsic stress value other than the first and second intrinsic stress values.

According to yet another illustrative embodiment of the present invention, a semiconductor device comprises a first device region including a plurality of first P-channel transistors and N-channel transistors, which form a first functional block. Moreover, the semiconductor device comprises a second device region including a plurality of second P-channel transistors and N-channel transistors, which form a second functional block. The device further comprises a first dielectric contact etch stop layer formed in the first device region and comprising a plurality of first portions having a first intrinsic stress value and a plurality of second portions having a second intrinsic stress value other than the first intrinsic stress value, wherein the first portions are formed above the P-channel transistors and wherein the second portions are formed above the N-channel transistors. Moreover, the semiconductor device comprises a second dielectric contact etch stop layer formed in the second device region, and comprising a plurality of first portions having the first intrinsic stress value and comprising a plurality of second portions having a third intrinsic stress value other than the first and second intrinsic stress values, wherein the first portions are formed above the P-channel transistors and the second portions are formed above the N-channel transistors.

BRIEF DESCRIPTION OF THE DRAWINGS

The invention may be understood by reference to the following description taken in conjunction with the accompanying drawings, in which like reference numerals identify like elements, and in which:

FIGS. 1a-1i schematically show cross-sectional views of a semiconductor device during various manufacturing stages, in which two different device regions receive differently stressed contact etch stop layers in accordance with illustrative embodiments of the present invention;

FIGS. 2a-2i schematically show cross-sectional views of a semiconductor device during various manufacturing stages, in which two different device regions are differently engineered for receiving different types of mechanical stress in accordance with further illustrative embodiments of the present invention.

Figure 1A:
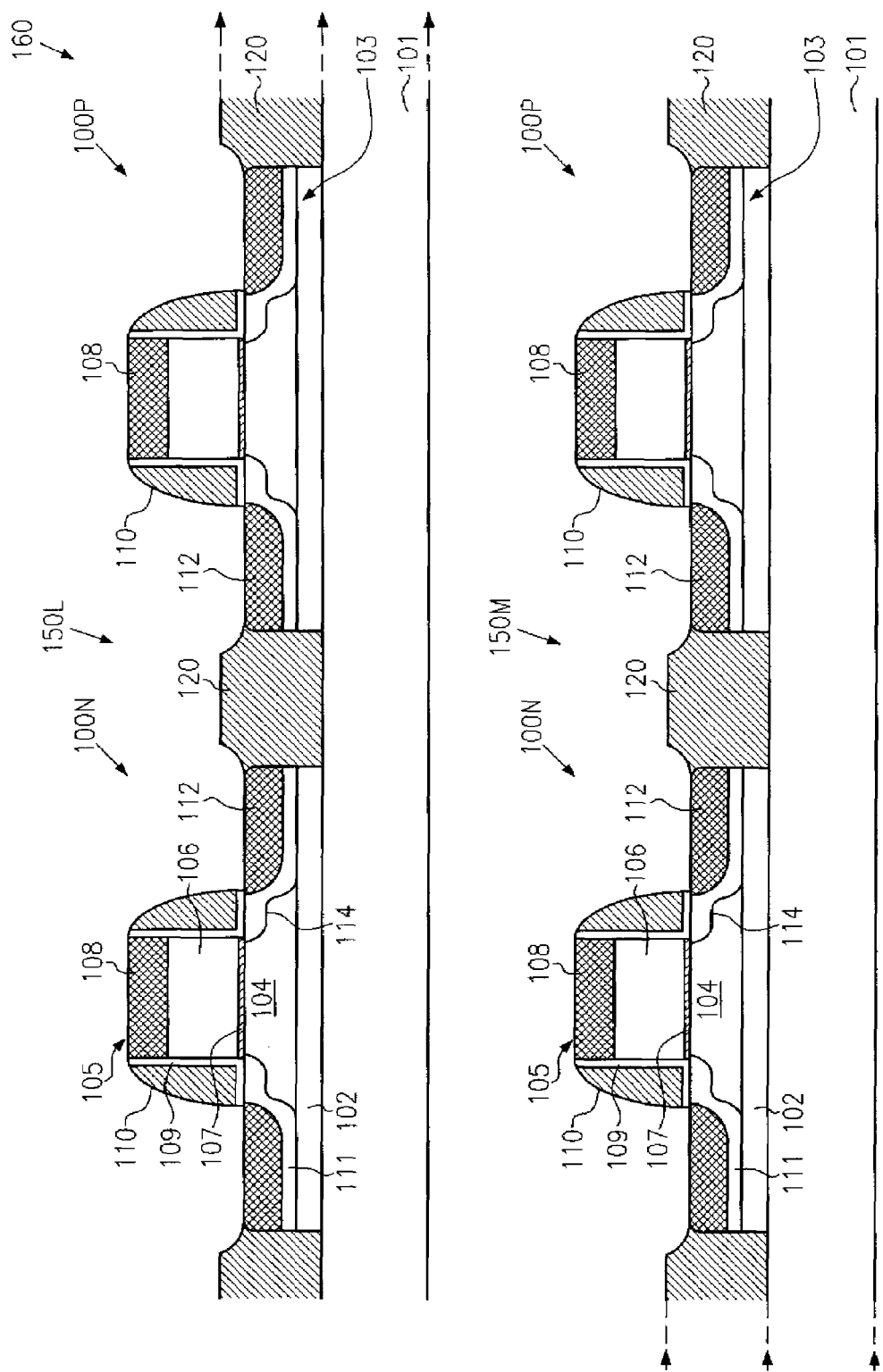

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally the present invention contemplates an enhanced stress engineering technique, in which a "stress" gradient in highly sensitive device regions is significantly relaxed, while, in other device regions, complementary transistors are formed such that performance of N-channel transistors and P-channel transistors is individually enhanced. Without intending to restrict the present invention to the following explanation, it is believed that certain device regions, such as regions with high integration density and in particular static RAM areas, may exhibit a high probability for device failure due to the presence of an increased stress gradient and/or due to the presence of tensile stress. Therefore, an effective stress engineering in the channel region of complementary transistors in less critical device regions, such as logic circuits, CPU cores and the like, may be efficiently applied, for instance by modifying the intrinsic stress of the contact etch stop layer, wherein the modification of the intrinsic stress thereof may be accomplished by adjusting process parameters during the formation of the contact etch stop layer and/or by a treatment with non-reactive ions and/or by removing certain portions of the layer, and the like. As previously explained, the dielectric contact etch stop layer is located above the respective transistor structures and therefore covers a large area of the transistor structure, thereby providing a high mechanical coupling efficiency to the respective channel region so that an effective stress engineering may be accomplished.

The present invention enables the modification or formation of appropriately designed dielectric contact etch stop layers with different stress characteristics at different die locations, i.e., on a "global scale," as well as on a "local scale," wherein different stress-inducing dielectric layers for corresponding transistor elements may be formed, thereby providing the potential for enhancing the overall performance of complex CMOS circuitries, such as CPUs, while, on the global scale of the device, sensitive device regions may be treated differently with respect to stress engineering, so that, in total, enhanced product reliability, without significant performance loss, may be achieved. As previously discussed, the stress-induced problems become more relevant with the continuous shrinkage of feature sizes, and hence the present invention is particularly advantageous in combination with highly scaled semiconductor devices, thereby providing the prospect for further device scaling without substantial loss of product yield caused by stress-induced problems in sensitive device regions.

With reference to the drawings, further illustrative embodiments of the present invention will now be described in more detail. FIG. 1a schematically shows a cross-sectional view of a semiconductor device 160 comprising a first device region 150L, which may represent a region including logic circuitry, which may be less sensitive with respect to stress gradients and or tensile stress, and a second device region 150M, which may represent a device region of high integration density, such as a static RAM area, acting as a cache memory region for a logic circuitry, such as the region 150L. The second device region 150M is comprised of devices that are more sensitive to stress gradients and/or tensile stress than the devices in the first device region 150L.

Each of the first and second device regions 150L, 150M may comprise a plurality of N-channel and P-channel transistors 100N, 100P, of which only one representative is shown for the sake of simplicity. It should be appreciated that the transistor elements 100N, 100P in the first device region 150L may be different in configuration from the corresponding N-channel transistors and P-channel transistors 100N, 100P of the second device region 150M, wherein, however, for convenience, any such structural differences are not illustrated in the drawings. For example, the transistors 100N, 100P in the second device region 150M may be configured for enhanced performance with respect to reduced leakage current and thus may exhibit a reduced current drive capability compared to the respective transistors of the first device region 150L. Consequently, although the transistors 100N, 100P of the first and second device regions 150L, 150M may differ from each other in size, conductivity type, location, function and the like, for convenience these transistors are shown to have substantially the same configuration and components, and hence the corresponding components of these transistors are denoted by the same reference numerals. It should also be noted that although the present invention is particularly advantageous for transistor elements without other stress-inducing components, such as additional epitaxy layers formed in or below the respective channel regions, the present invention may also be combined with such additional stress-creating techniques. It should also be appreciated that in the following description of further illustrative embodiments of the present invention, it is referred to transistor elements provided in the form of silicon-on-insulator (SOI) devices having a standard configuration, that is, having no raised drain and source regions. As will be apparent in the course of the description, the present invention may also be applied to transistor architectures based on bulk semiconductor substrates or SOI substrates, in which transistor designs having raised drain and source regions as well as standard configurations may be used.

The semiconductor device 160 comprises a substrate 101 having formed thereon an insulating layer 102, such as a buried silicon dioxide layer, silicon nitride layer and the like, followed by a crystalline semiconductor layer 103, which, in some illustrative embodiments, is a silicon layer, since the vast majority of integrated circuits including complex logic circuits are based on silicon. It should be appreciated, however, that the semiconductor layer 103 may be comprised of any appropriate semiconductor material as required by design rules. For instance, silicon/germanium mixtures or silicon/carbon mixtures and the like may also be considered as silicon-based material. The respective N-channel and P-channel transistors 100N, 100P may be separated from each other by an isolation structure 120, for instance in the form of a shallow trench isolation. The N-channel and P-channel transistors 100N, 100P further comprise a gate electrode structure 105 including a semiconductor portion 106, such as a polysilicon portion, and a metal-containing portion 108, for instance provided in the form of a metal silicide. The respective gate electrode structures 105 further comprise a gate insulation layer 107 separating the gate electrode structure 105 from corresponding channel regions 104, which in turn laterally separates appropriately doped source and drain regions 111 having formed therein metal silicide regions 112. A spacer element 110 is formed adjacent to the sidewalls of the gate electrode structure 105, and may be separated therefrom by a liner 109. It should be appreciated that the P-channel transistor 100P and the N-channel transistor 100N are different with respect to the corresponding dopant materials and concentrations in the respective drain and source regions 111 as well as in the gate electrode 105.

A typical process flow for forming the semiconductor device 160 as shown in FIG. 1a may comprise the following processes. The substrate 101, the insulating layer 102 and the semiconductor layer 103 may be formed by advanced wafer bond techniques, when the semiconductor device 160 is to represent an SOI device, or the substrate 101 may be provided without the insulating layer 102, that is, as a bulk semiconductor substrate, wherein the semiconductor layer 103 may represent an upper portion of the substrate or may be formed by epitaxial growth techniques. Thereafter, the gate insulation layer 107 may be deposited and/or formed by oxidation in accordance with well-established process techniques, wherein the respective gate insulation layers in the first and second device regions 150L, 150M may be formed with a different thickness and/or material composition. For example, the respective gate insulation layers 107 in the second device region 150M may have an increased thickness so as to reduce static leakage currents. Thereafter, a gate electrode material, such as polysilicon, may be deposited by means of low pressure chemical vapor deposition (LPCVD). Thereafter the gate electrode material and the gate insulation layer 107 may be patterned by sophisticated photolithography and etch techniques in accordance with well established process recipes. Next, implantation cycles in combination with various manufacturing processes for forming the spacer element 110 may be performed, wherein the spacer element 110 may be formed as two or more different spacer elements with intermediate implantation processes, when a sophisticated laterally profiled dopant concentration is required for the drain and source regions 111. For example, extension regions 114 of reduced penetration depth may be required.

After any anneal cycles for activating and partially curing implantation-induced crystal damage, the metal silicide regions 108 and 112 are formed by, for instance, depositing a refractory metal and initiating a chemical reaction with the underlying silicon, wherein the spacer element 110 acts as a reaction mask for preventing or reducing the formation of metal compound between the gate electrode structure 105 and the drain and source regions 111.

Figure 1B:
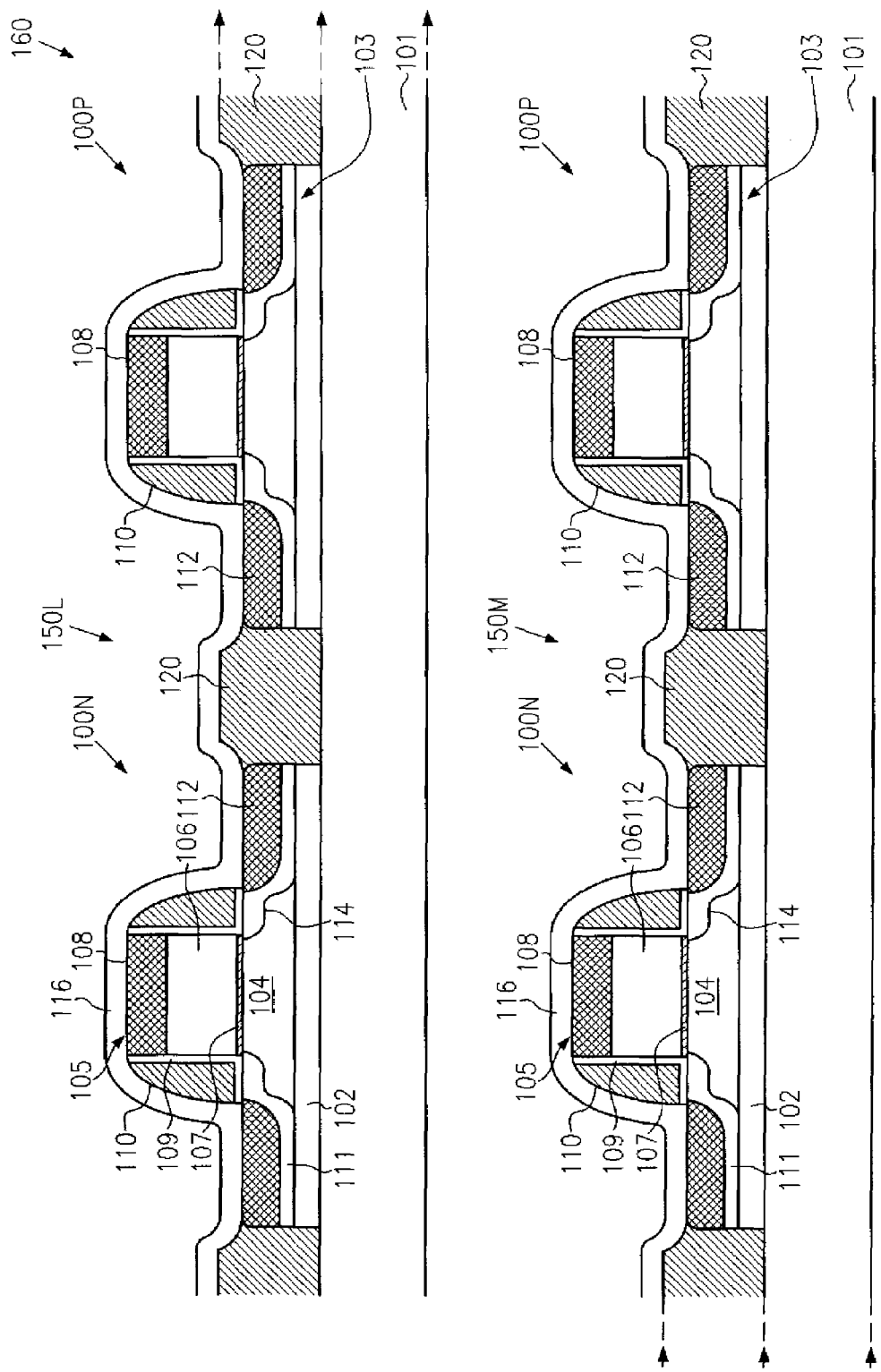

FIG. 1b schematically shows the semiconductor device 160 with a first dielectric layer 116 formed above the first and second device regions 150L, 150M. Typically, the transistor elements 100N, 100P are embedded in an interlayer dielectric material (not shown in FIG. 1b), over which corresponding metallization layers are to be formed to establish the required electrical connections between the individual circuit elements. The interlayer dielectric material has to be patterned to provide contacts to respective regions of the transistor elements 100N, 100P, wherein the patterning process is based on an anisotropic etch process. For reliably controlling this anisotropic etch process, the first dielectric layer 116 is designed as an etch stop layer, which will also be referred to as a contact etch stop layer. Frequently, the interlayer dielectric material may be comprised of silicon dioxide and thus the first dielectric layer 116 may be comprised of silicon nitride, as silicon nitride exhibits a good etch selectivity for well-established anisotropic etch recipes for etching silicon dioxide.

Silicon nitride may be deposited in accordance with well-established deposition recipes, wherein the deposition parameters may be adjusted to provide a specific intrinsic mechanical stress while still maintaining a desired high etch selectivity to silicon dioxide. Typically, silicon nitride is deposited by plasma enhanced chemical vapor deposition (PECVD), wherein, for example, parameters of the plasma atmosphere, such as the bias power supplied to the plasma atmosphere, may be varied in order to adjust the mechanical stress created in the silicon nitride layer as deposited. For example, the deposition may be performed on the basis of well-established process recipes based on silane ($SiH_4$) and ammonia ($NH_3$), nitrogen oxide ($N_2O$) or nitrogen ($N_2$) in a deposition tool for PECVD for a silicon nitride layer. The intrinsic stress in the silicon nitride layer may be determined by the deposition conditions, wherein, for instance, a compressive stress in silicon nitride up to approximately 1.5 GPa may be obtained with a moderately high bias power according to well-established deposition recipes, while, with appropriately adjusted parameters, a tensile stress of up to approximately 1.5 GPa may be achieved. In general, the stress created in the silicon nitride during the deposition may, in addition to the ion bombardment, also depend on the gas mixture, the deposition rate and the temperature.

In one embodiment, the first dielectric layer 116 may be deposited as a silicon nitride layer having a specified compressive stress with a value up to 1.5 GPa. In other embodiments, the layer 116 may be formed to exhibit a specified tensile stress.

Figure 1C:
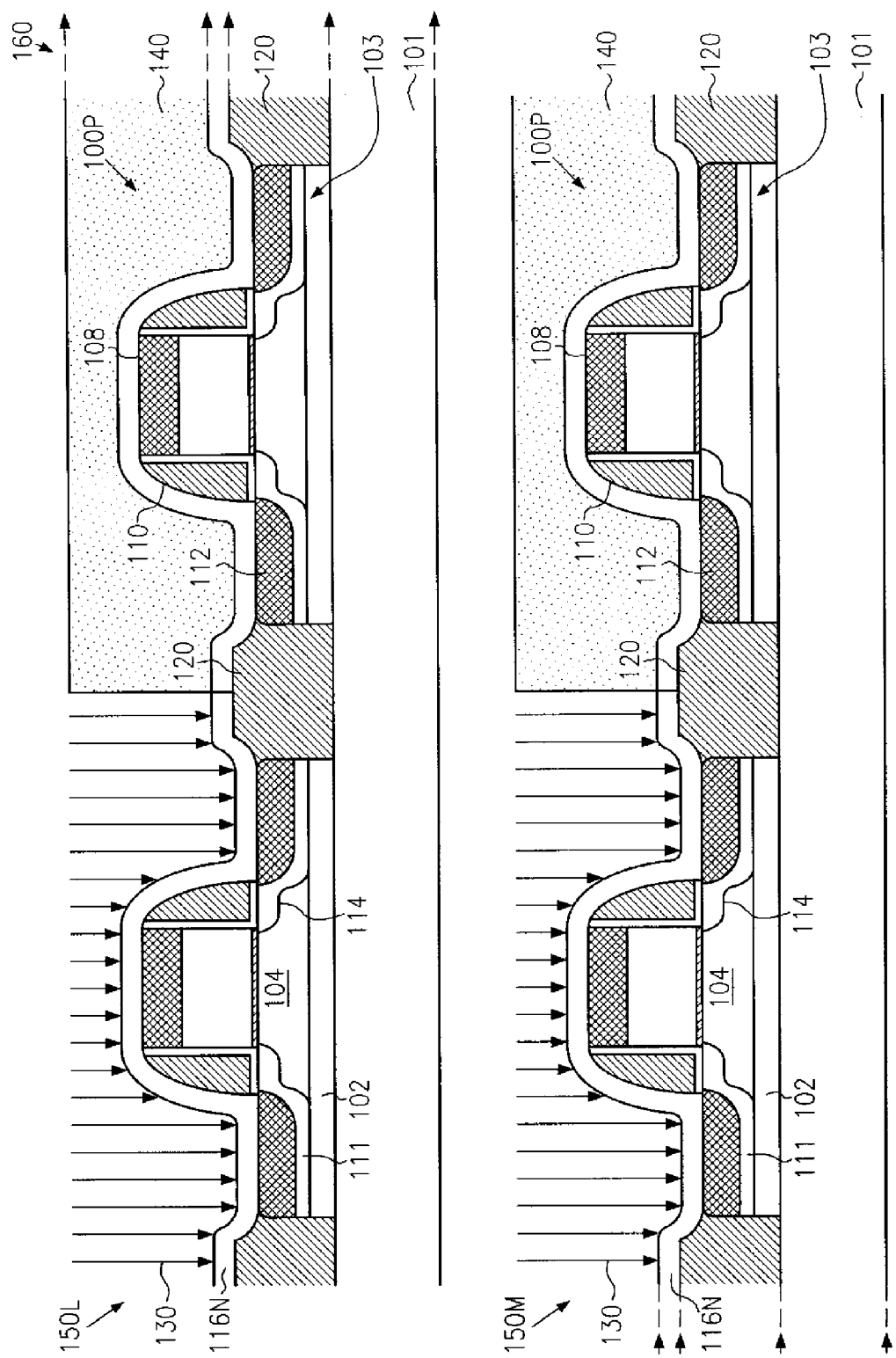

FIG. 1c schematically shows the semiconductor device 160 with a resist mask 140 formed thereon, wherein the resist mask 140 may expose the N-channel transistor elements 100N in the first and second device regions 150L, 150M, while covering the respective P-channel transistors 100P. The resist mask 140 may be formed in accordance with photolithography masks that are also employed in the formation of P-type and N-type transistors so that a corresponding photolithography step may be readily incorporated into a conventional process flow. Moreover, the semiconductor device 160 is subjected to a treatment 130 with non-reactive ions including, for instance, xenon, germanium and the like, when the treatment 130 is performed as an ion implantation process. Due to the ion bombardment, the molecular structure of exposed portions 116N of the layer 116 is modified to significantly reduce the intrinsic stress within the portions 116N of the layer 116. Moreover, the ion bombardment 130 may also significantly modify the etch behavior of the respective portions 116N, due to forming a plurality of diffusion paths by the ion bombardment 130. An increased etch rate for the exposed portion 116N, in particular for the transistor 100N in the first device region 150L, may be advantageous in the subsequent manufacturing process as will be described later on.

The process parameters of the treatment 130, when performed as an ion implantation process, may be selected in accordance with a layer thickness of the first dielectric layer 116 and the type of ion species used. For instance, a dose of approximately $10^{15}$-$10^{16}$ ions/cm$^2$ may be used with an ion implantation energy of approximately 10-100 keV for a layer thickness of approximately 50-100 nm for the above-specified ion species. However, relevant parameter values may be readily determined by simulation and/or experiment. In other embodiments, the treatment 130 may be performed in a plasma atmosphere on the basis of inert gases, such as argon, helium and the like, which show a higher penetration depth at lower acceleration energies, thereby also rendering the ion energies created in a plasma atmosphere appropriate for relaxing the intrinsic stress in the exposed portions 116N. An appropriate plasma atmosphere may be generated in any appropriate plasma etch or plasma deposition tool.

Figure 1D:
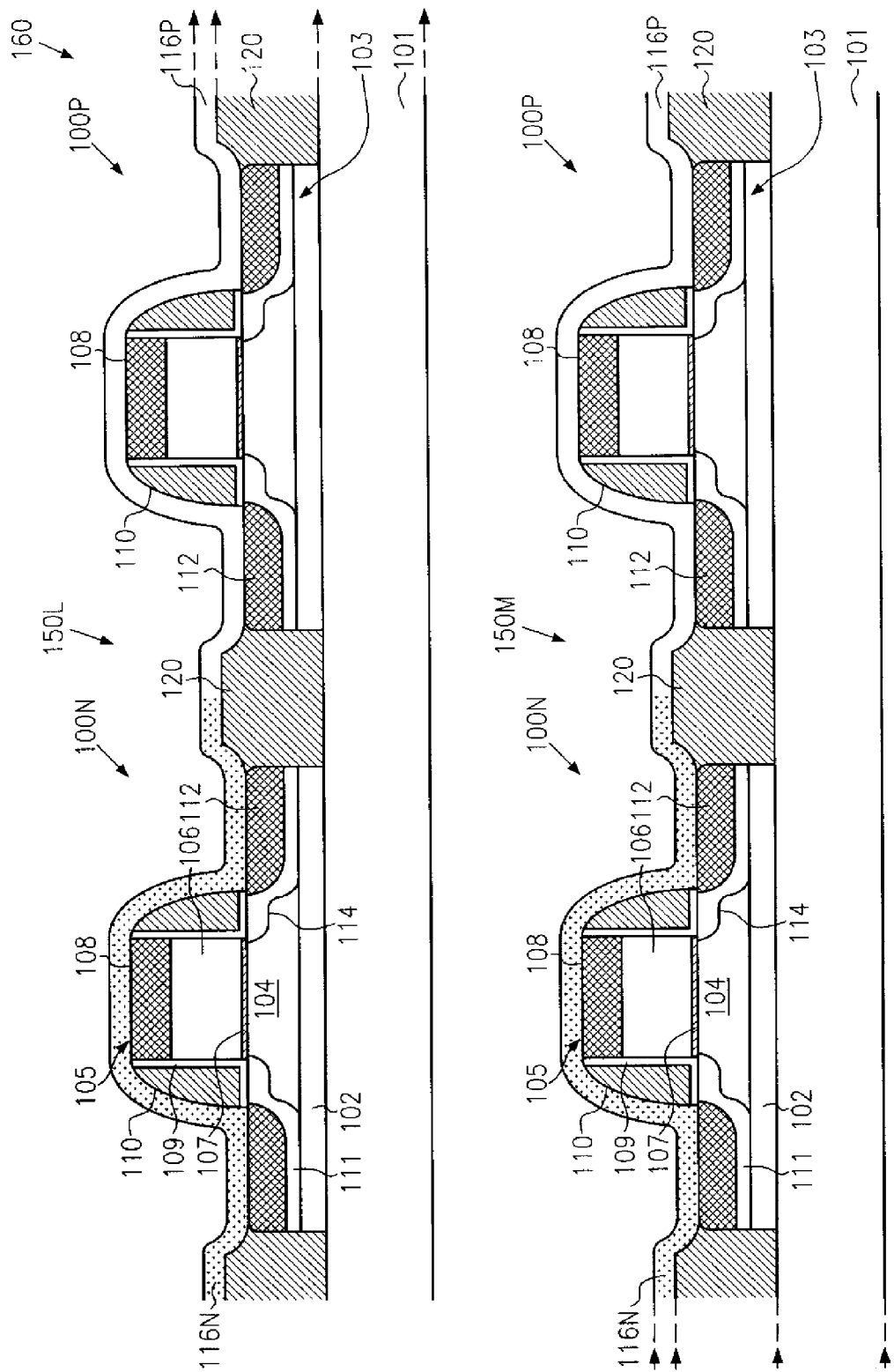

FIG. 1d schematically shows the semiconductor device 160 after completion of the treatment 130. Consequently, a stress-reduced or a substantially relaxed portion 116N (depending on the design requirements) is provided above the transistors 100N of the first and second device regions 150L, 150M, while respective portions 116P still have the compressive stress of the initially deposited dielectric layer 116.

FIG. 1e schematically shows the semiconductor device 160 with a further resist mask 141 formed above the first and second device regions 150L, 150M, wherein the resist mask 141 is configured to expose the N-channel transistor 100N of the first device region 150L to an etch process 131 for removing the portion 116N. The etch process 131 is designed such that it exhibits a moderately high etch selectivity with respect to the underlying metal silicide regions 108 and 112, wherein, as previously explained, the treatment 130 may have a significant influence on the etch rate during the process 131. Due to the enhanced diffusion behavior of the stress-relaxed and modified portion 116N, a higher etch rate may be achieved, thereby also significantly enhancing the etch selectivity of the layer portion 116N with respect to the underlying metal silicide. Consequently, an unwanted undue silicide erosion during the etch process 131 may be significantly reduced. In other embodiments, the etch time of the process 131 may be selected such that undue material removal from the metal silicide regions 108 and 112 may be avoided, wherein any possible residuals of the layer portion 116N may not substantially adversely affect the transistor performance of the device 100N, since the initial compressive stress has been substantially relaxed in the previous treatment 130, in which the corresponding implantation energy may be selected so as to substantially completely relax the layer portion 116N, since any ion penetration into the metal silicide regions 108 and 112 may be less critical.

FIG. 1f schematically shows the semiconductor device 160 after removal of the resist mask 141. Consequently, the N-channel transistor 100N of the first device region 150L is substantially exposed, while the corresponding P-channel transistors 100P are covered by compressively stressed layer portions 116P. The N-channel transistor 100N of the second device region 150M is still covered by the modified layer portion 116N.

Figure 1G:
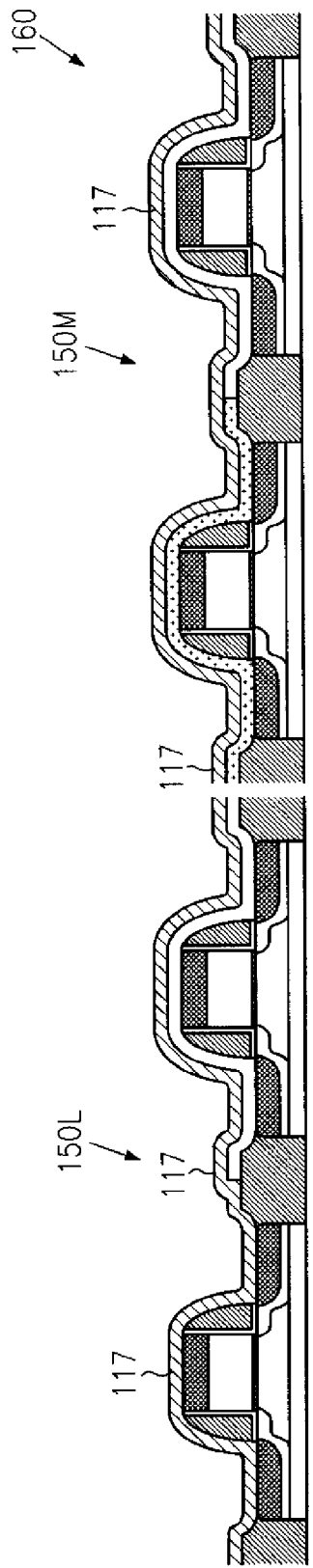

FIG. 1g schematically shows the semiconductor device 160 with a second dielectric layer 117 having a second intrinsic stress of specified magnitude. In one illustrative embodiment, the second dielectric layer 117, which may also be referred to as a second dielectric contact etch stop layer, has a tensile stress with a value up to approximately 1.5 GPa. Regarding any techniques for forming the dielectric layer 117, the same criteria apply as previously described with reference to the layer 116.

Figure 1H:
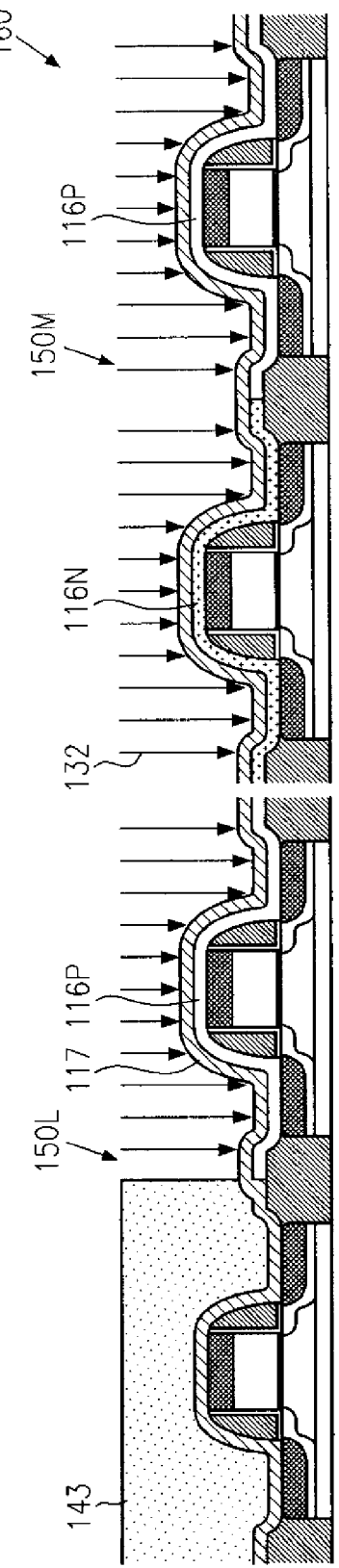

In FIG. 1h, a further resist mask 143 is formed above the semiconductor device 160, wherein the resist mask 142 covers the N-channel transistor 100N of the first device region 150L, while exposing the P-channel transistor 100P of the first device region 150L and also exposing the N-channel and P-channel transistors 100N, 100P of the second device region 150M. Moreover, the semiconductor device 160 is subjected to a further treatment 132, which may be designed, in one particular embodiment, as an etch process for removing the exposed portion of the second dielectric layer 117. For example, an anisotropic or isotropic etch process based on well-established etch chemistries may be performed to selectively remove the exposed portion of the second dielectric layer 117. In one illustrative embodiment, the controlling of the etch process 132 may be enhanced by forming a thin liner (not shown) prior to the deposition of the second dielectric layer 117. For instance, a thin silicon dioxide layer or silicon oxynitride layer with a thickness of approximately 5-15 nm may be formed for enhanced process control during the treatment 132, while not unduly affecting the stress transfer mechanism of the layer 117 within the first transistor 100N in the first device region 150L. In other embodiments, the etch process 132 may be controlled on the basis of etch time without any provision of an intermediate liner.

In still other embodiments, the treatment 132 may comprise an ion bombardment so as to significantly reduce the intrinsic stress in the exposed portion of the second dielectric layer 117. In one embodiment, an etch process may be performed subsequently to remove a significant portion of the exposed portion of the layer 117, wherein etch time control is less critical, since any residuals of the layer 117, for instance above the P-channel transistors loop, may not unduly affect the compressive stress in the underlying portions 116P due to the preceding stress relaxation. In still other embodiments, the treatment 132 in the form of an ion bombardment may be performed without a subsequent etch process for material removal of the exposed portion of the layer 117.

FIG. 1i schematically shows the semiconductor device 160 after completion of the treatment 132, when the treatment 132 comprises an etch process for removing or substantially removing the exposed portion of the layer 117 in FIG. 1h. Consequently, in the first device region 150L, the N-channel transistor 100N comprises the layer portion 117N including the second intrinsic stress, in the example shown a tensile stress, while the P-channel transistor comprises the layer portion 116P having the first intrinsic stress, in the example shown a compressive stress. On the other hand, in the second device region 150M, the N-channel transistor 100N comprises a relaxed layer portion 116N, thereby contributing none or a significantly reduced amount of stress that may be transferred into the respective channel region, while the P-channel transistor 100P is still covered by the layer portion 116P having the first intrinsic stress, i.e., in the example shown a compressive stress. As a result, the performance of the transistors in the first device region 150L may be individually enhanced by means of an effective stress engineering, while excessive stress gradients may be avoided in the second device region 150M, wherein, in the illustrated embodiment, a tensile strain inducing layer portion of a respective contact etch stop layer may be substantially avoided. Consequently, performance of the P-channel transistor 100P in the first device region 150L may still be increased, while nevertheless reducing the risk for device failure in the highly sensitive second region 150M.

It should be appreciated that the configuration as shown in FIG. 1i may also be achieved by starting with the layer 116 in FIG. 1a as a layer having an intrinsic tensile stress. For this purpose, the corresponding masking scheme as accomplished by the resist mask 140 (FIG. 1c), the mask 141 (FIG. 1e) and the mask 142 (FIG. 1h) has to be inverted, that is, for instance in FIG. 1b, the corresponding N-channel transistors 100N in the first and second device regions 150L, 150M have to be covered, while the P-channel transistors have to be exposed. The same applies to FIGS. 1e and 1h.

Figure 2A:
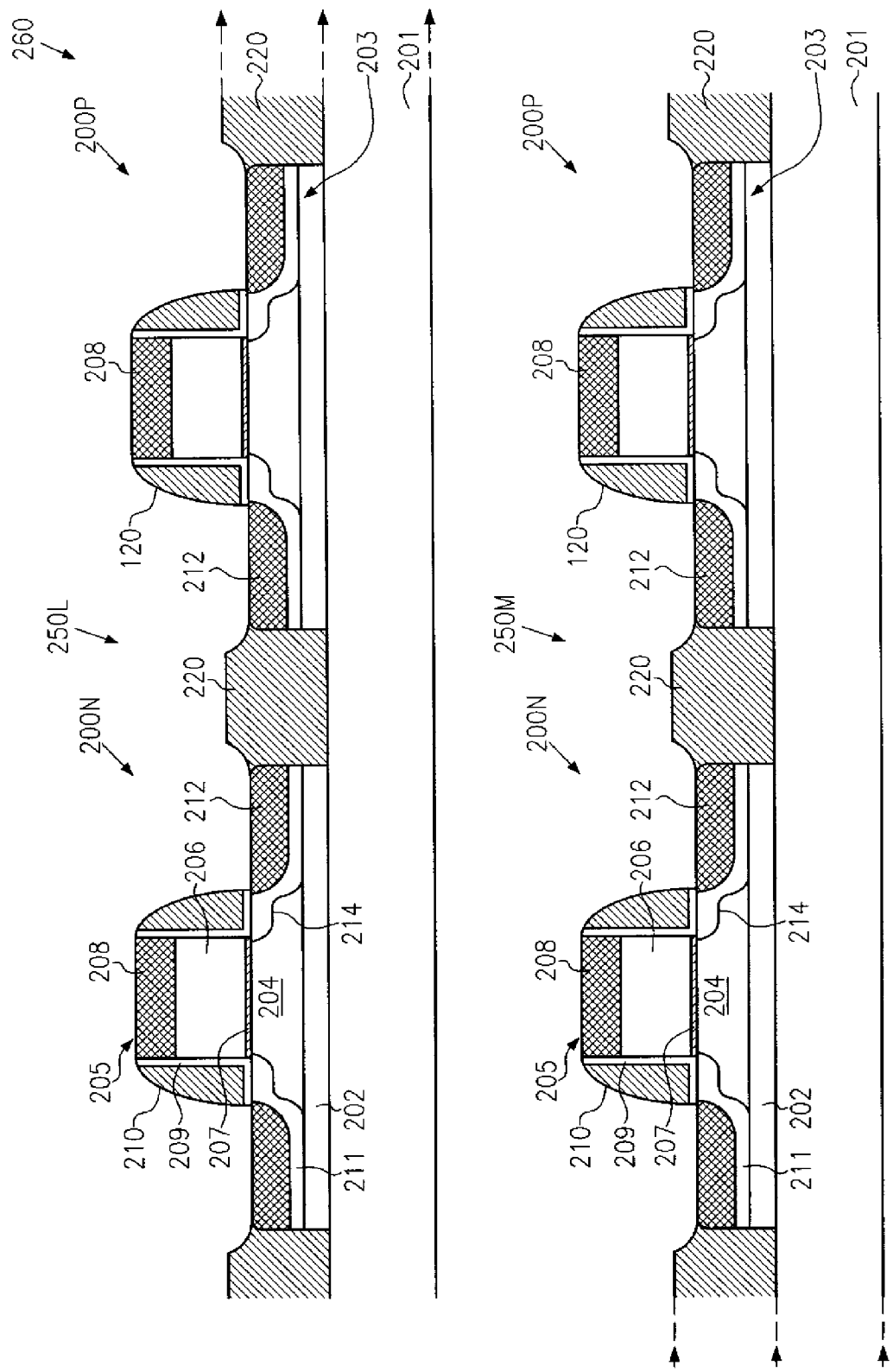

With reference to FIGS. 2a-2i, further illustrative embodiments of the present invention will now be described in more detail. FIG. 2a schematically shows the semiconductor device 260, which may have substantially the same configuration as the semiconductor device 160 described with reference to FIG. 1a. Consequently, the corresponding components are denoted by the same reference numbers, except for a leading "2" instead of a leading "1." A corresponding description of the respective components is omitted, since the same criteria apply for these components as are previously explained with reference to FIG. 1a.

Figure 2B:
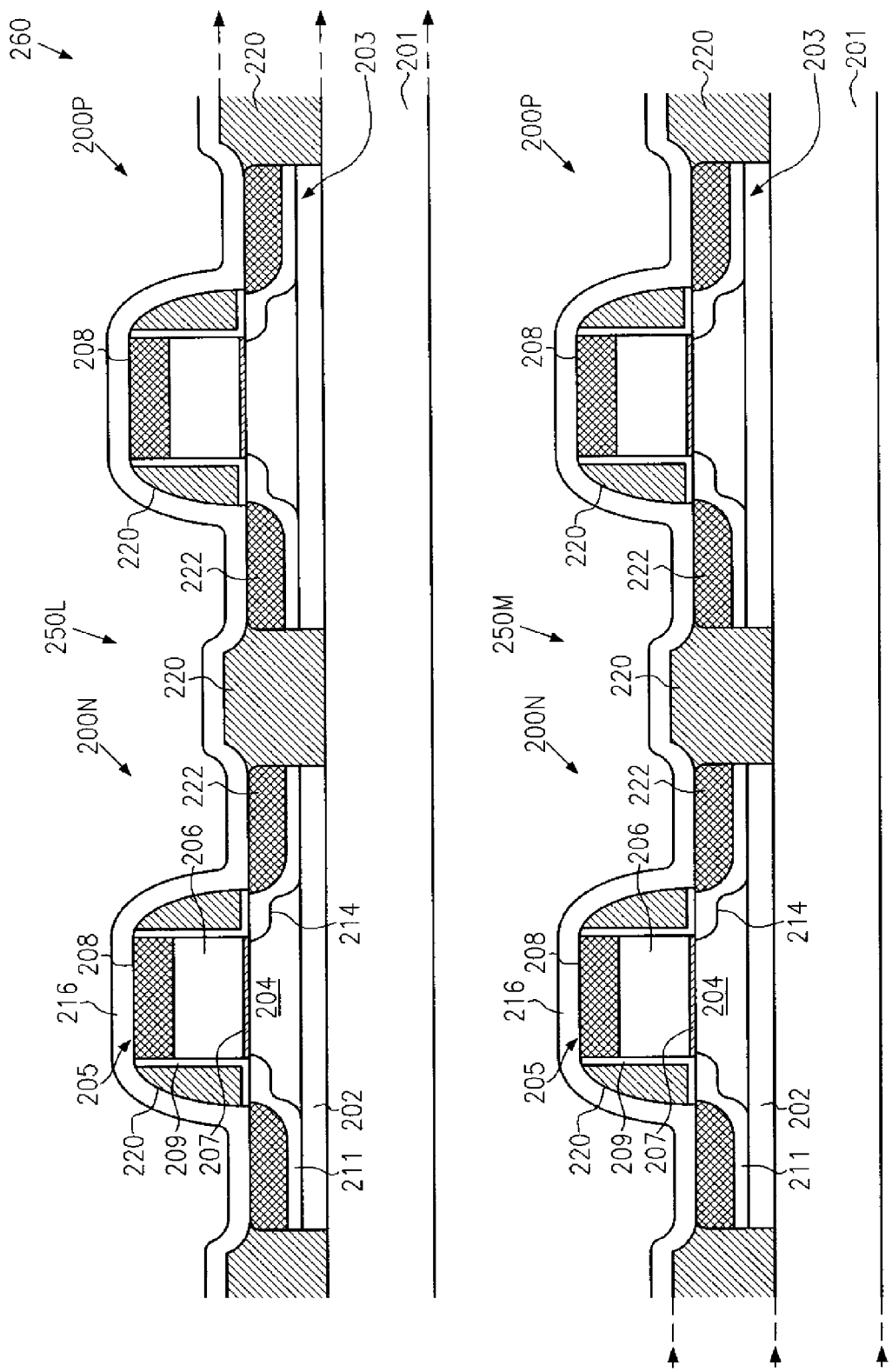

FIG. 2b schematically shows the semiconductor device 260 with the first dielectric layer 216 formed above the first and second device regions 250L and 250M, wherein the first layer 216 may have specified intrinsic stress, which, in one illustrative embodiment, is a compressive stress of specified magnitude.

Figure 2C:
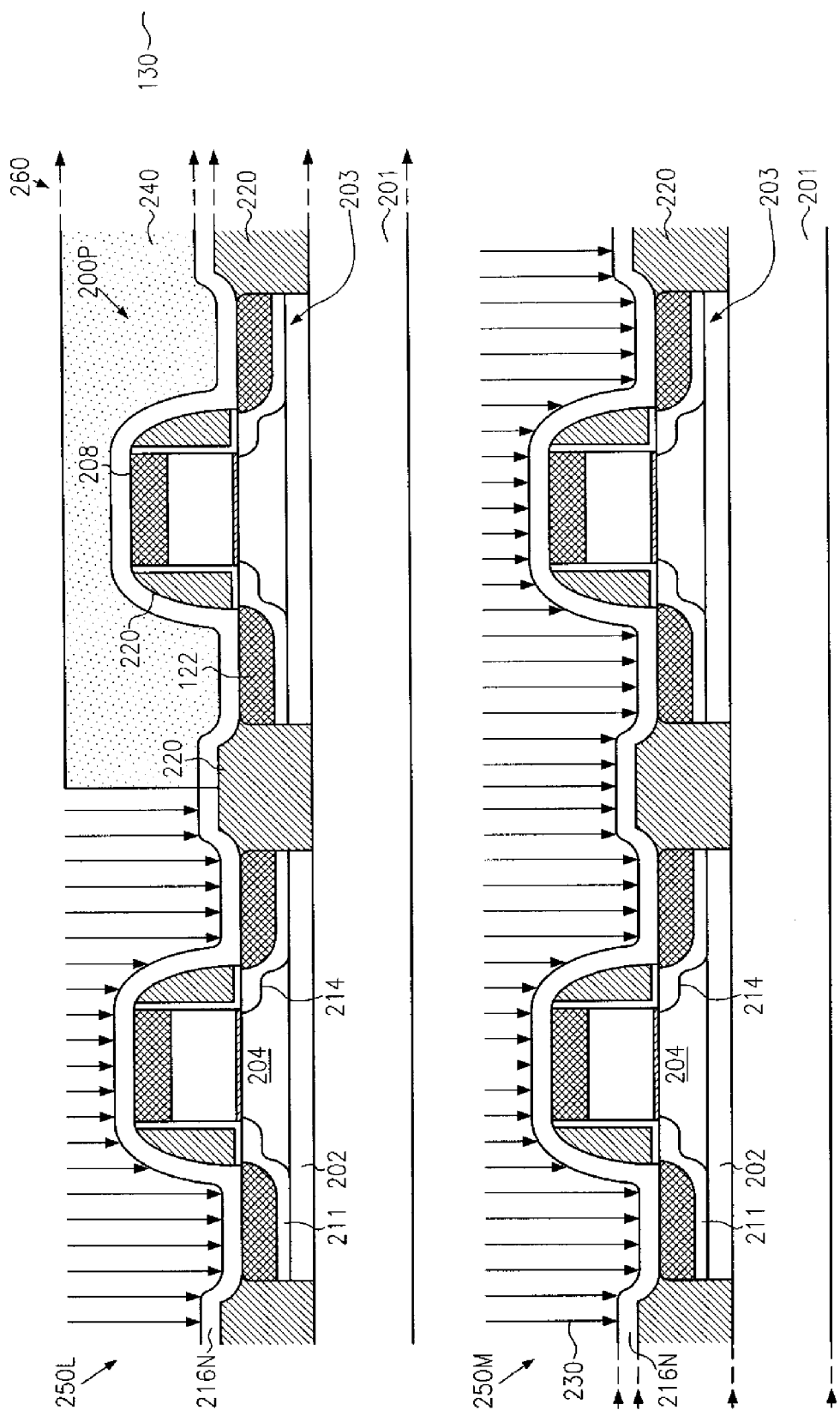

FIG. 2c schematically shows the semiconductor device 260 with a resist mask 240 formed thereon, wherein the resist mask 240 covers the P-channel transistor 200P in the first device region 250L, while exposing the N-channel transistor 200N in the first device region 250L and also exposing the N-channel and P-channel transistors 200N, 200P in the second device region 250M. Moreover, the device 260 is subjected to a treatment 230 which may be designed as an ion implantation process or as any other ion bombardment process, as is also described with reference to the treatment 130. Thus, the exposed portions of the layer 216, referred to as 216N, may experience a stress relaxation depending on the process parameters of the treatment 230.

Figure 2D:
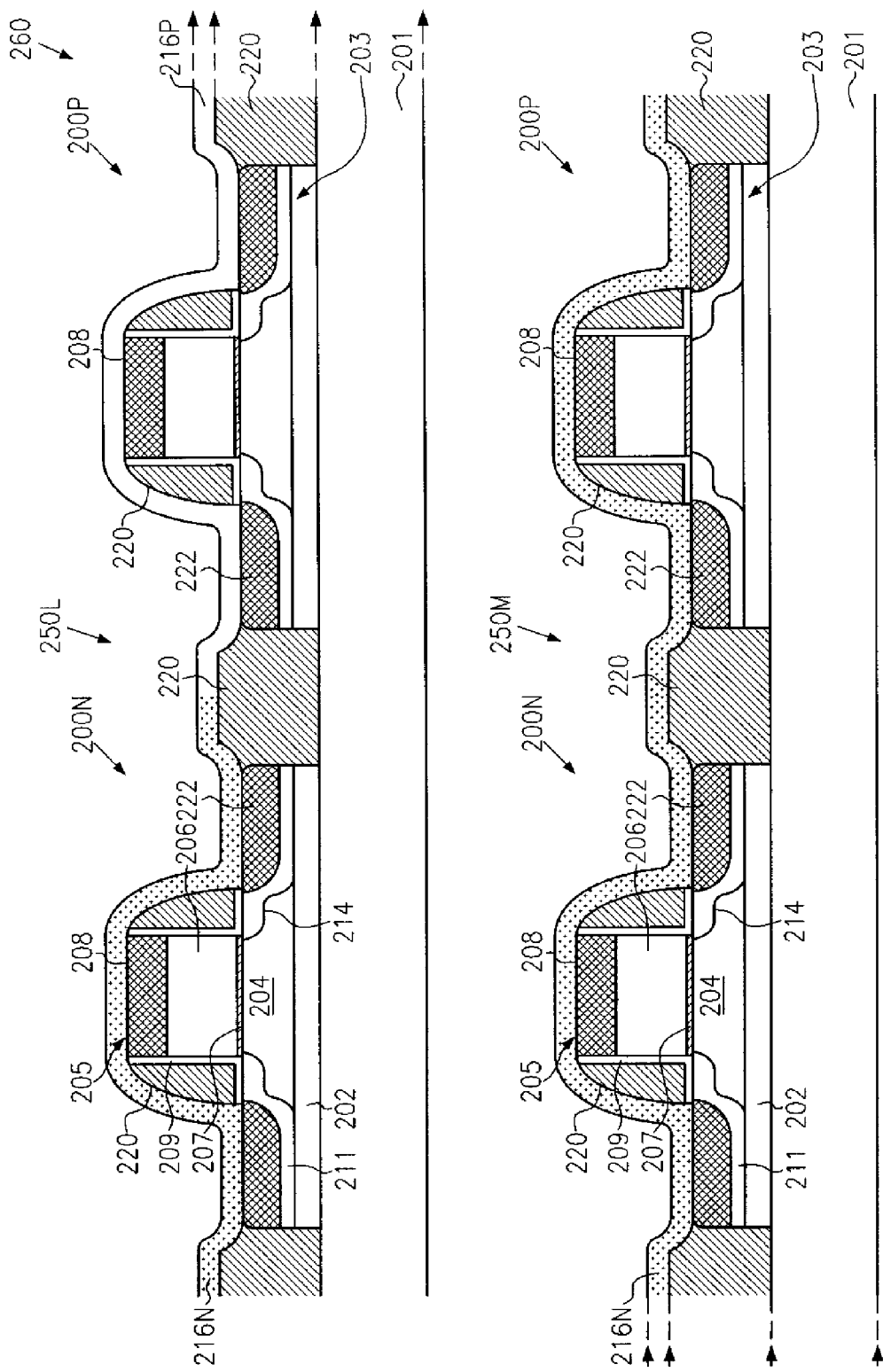

FIG. 2d schematically shows the device 260 after the removal of the resist mask 240 with the stress relaxed portions 216N in the N-channel and P-channel transistors 200N, 200P in the second device region 250M and in the N-channel transistor 200N in the first device region 250L.

FIG. 2e schematically shows the device 260 in a further advanced manufacturing stage, in which a resist mask 241 is formed thereon, thereby covering the second device region 250M and the P-channel transistor 200P in the first device region 250L. Moreover, the device 260 is subjected to an etch process 231 for removing the exposed portion 216N. As previously explained, the treatment 230 may also significantly alter the etch behavior of the exposed portions 216N, so that an increased etch selectivity with respect to the underlying metal silicide regions 208 and 212 is achieved during the etch process 231, thereby reducing undue material erosion in these regions. Moreover, the etch time during the etch process 231 may be selected to avoid or reduce undue material removal from the metal silicide regions, since any residues may not substantially negatively influence the transistor performance of the device 200N as these residues are substantially relaxed. In other embodiments, the preceding treatment 230 may have been performed on the basis of the resist mask 240, which may only expose the second device region 250M, while completely covering the first device region 250L so that the etch process 231 may be performed without a previous relaxation of the exposed portion 216N.

FIG. 2f schematically shows the semiconductor device 260 after the completion of the etch process 231 and the removal of the resist mask 241.

Figure 2G:
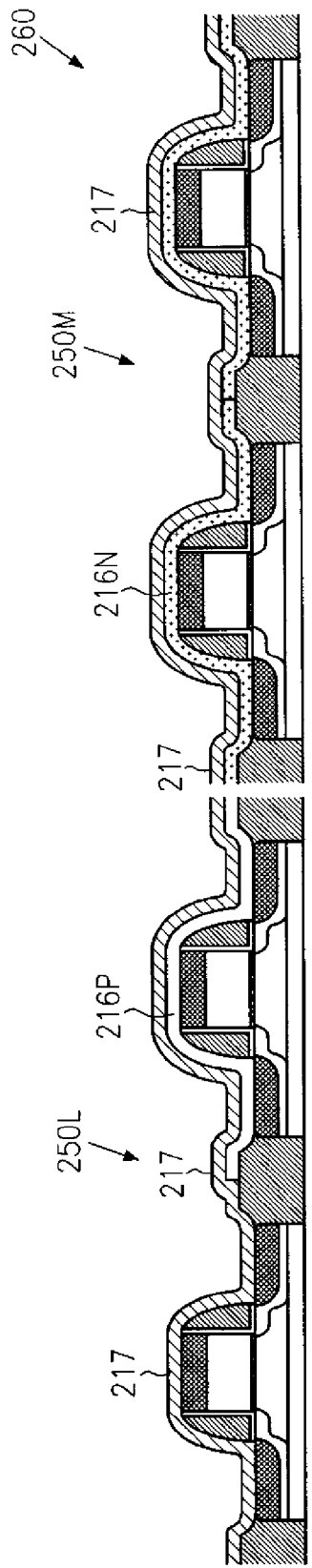

FIG. 2g schematically shows the semiconductor device 260 with a second dielectric layer 217 formed thereon, wherein the second layer 217 comprises a second intrinsic stress, which may be a tensile stress when the first intrinsic stress is a compressive stress.

Figure 2H:
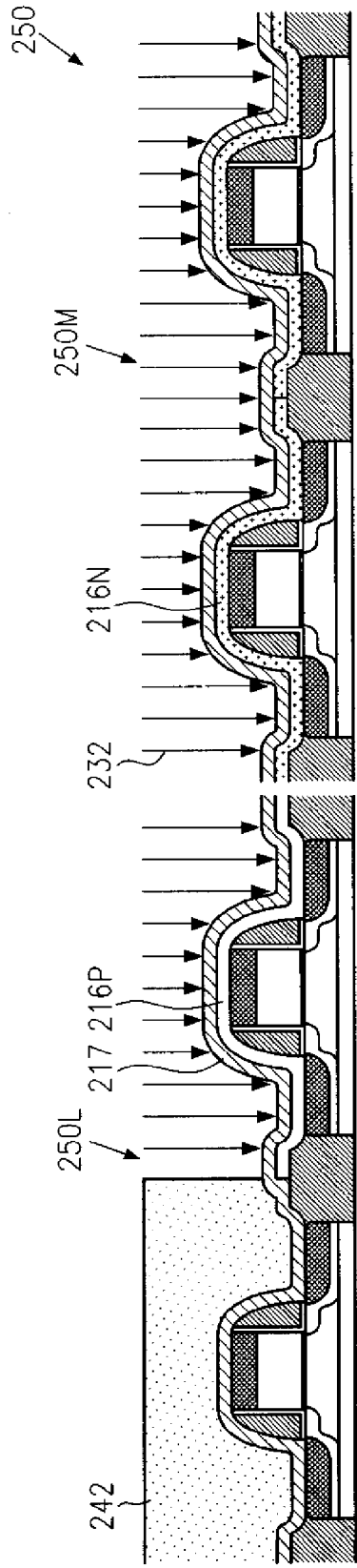

FIG. 2h schematically shows the device 260 having formed thereon a further resist mask 242, which covers the N-channel transistor 200N while exposing the P-channel transistor 200P in the first device region 250L and also exposing the N-channel and P-channel transistors in the second device region 250M. Moreover, the device 260 is subjected to a further treatment 232, which, in one illustrative embodiment, may be designed as an etch process for substantially removing the exposed portion of the layer 217. As previously explained with reference to the layer 117, the treatment 232 may also comprise an ion bombardment for substantially relaxing the second intrinsic stress. In still other embodiments, an ion bombardment may be combined with an etch process to reduce any constraints with respect to etch time control, since any residues of the second dielectric layer may not substantially unduly affect the device performance due to the preceding relaxation process. Moreover, as previously explained, in some embodiments, an appropriate liner (not shown) may be deposited prior to the deposition of the second dielectric layer 217, which may act as an etch stop layer during the treatment 232. For example, if the second dielectric layer 217 is formed of silicon nitride, a corresponding liner may be formed of silicon dioxide, silicon oxynitride and the like.

Figure 2I:
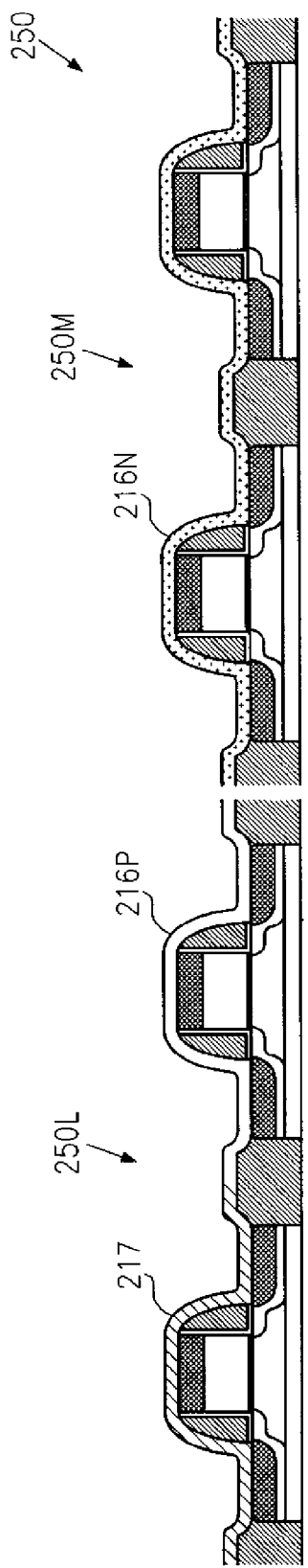

FIG. 2i schematically shows the semiconductor device 260 after the completion of the treatment 232 and the removal of the resist mask 242. Consequently, the N-channel transistor in the first device region 250L comprises the layer portion 217 having the second intrinsic stress, while the P-channel transistor is still covered by the portion 216P having the first intrinsic stress. On the other hand, the P-channel transistor and the N-channel transistor in the second device region 250M are still covered by the relaxed portions 216N. Consequently, any stress gradients or stress-inducing mechanisms are significantly suppressed in the second sensitive device region 250M, while the performance of the transistors in the first device region 250L is individually enhanced by providing a corresponding strain-inducing contact etch stop layer portion.

As previously explained with reference to the device 160, the manufacturing sequence may be correspondingly designed to start with a tensile contact etch stop layer by correspondingly providing an inverse masking scheme. Moreover, it should be appreciated that, in the previous embodiments, the first and second contact etch stop layers 116, 117, 216 and 217 are described as silicon nitride layers, since a silicon nitride layer may provide an efficient mechanism for generating intrinsic stress and may also have an excellent selectivity to an interlayer dielectric material, such as silicon dioxide, which is frequently used for embedding the transistor elements in the first and second device regions. However, materials other than silicon nitride may be used, such as silicon oxynitride, silicon dioxide and the like, as long as the required etch selectivity in combination with the subsequently formed interlayer dielectric material is maintained.

Figure 3:
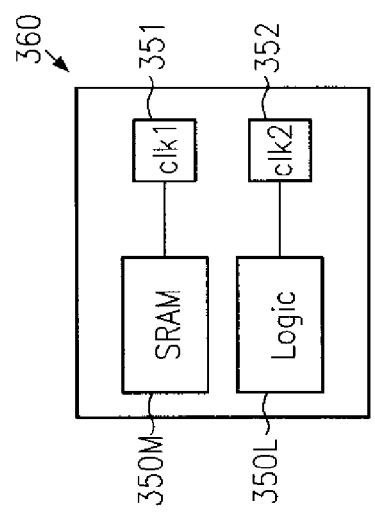
FIG. 3 schematically shows a block diagram of a semiconductor device having a memory region and a logic region, which are differently designed with respect to a strain generation mechanism in the respective transistor elements according to still further illustrative embodiments of the present invention.

FIG. 3 schematically shows a block diagram of a semiconductor device 360 comprising a first device region 350L and a second device region 350M. Moreover, a first clock signal source 352 and a second clock signal source 351 may be provided, wherein the first source 352 is connected to the first device region 350L while the second clock source 351 is connected to the second device region 350M. The first device region 350L and the second device region 350M may each comprise a plurality of N-channel transistors and P-channel transistors, wherein the corresponding transistor elements in the second device region 350M may be configured differently compared to the corresponding transistor elements in the first device region 350L. In one illustrative embodiment, the second device region 350M may represent a static RAM area including corresponding P-channel and N-channel transistors with an increased integration density. Consequently, the second device region 350M may be sensitive to increased strain-inducing mechanisms. On the other hand, the first device region 350L may include fast-switching transistor elements with a reduced integration density, in which P-channel transistors and N-channel transistors may have individually adapted contact etch stop layers for enhancing charge carrier mobility in the respective channel regions. Similarly, the respective transistor components in the first and second clock sources 352, 351 may be formed according to design principles as are applied to the first device region 350L.

The semiconductor device 360 may be formed in accordance with the process sequences as previously explained with reference to FIGS. 1a-1i and 2a-2i referring to the devices 160 and 260. Moreover, the circuit layout in the device 360 may be reconfigured such that the second device region 350M may operate at an increased frequency even though the individual transistor elements may not be optimized for high switching speeds. Consequently, the second clock source 351 may operate at an increased frequency compared to the clock source 352. In this way, a possible loss in performance due to a reduced stress engineering in the second device region 350M may be compensated for by a corresponding redesign and an increased clock frequency of the second clock source 352, while nevertheless providing enhanced reliability during operation, since SRAM failures may be significantly reduced due to the reduction of tensile stress or stress gradients.

As a result, the present invention provides an improved technique that enables the formation of P-channel and N-channel transistors of enhanced performance within less critical device regions, while providing reduced stress and strain in critical, i.e., high density, device regions, such as static RAM areas, which are frequently used as cache memories for CPUs. For this purpose, process techniques may be used in which the stress in contact etch stop layers is efficiently modified globally within a die region without unduly affecting transistor devices, for which an individual adaptation of the channel strain is desired. Moreover, etch processes may be performed in some embodiments in such a manner that undue metal silicide erosion may be reduced or avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a first device region including a plurality of first P-channel transistors and first N-channel transistors, said first P-channel transistors and said first N-channel transistors forming a first functional block;
   a second device region including a plurality of second P-channel transistors and second N-channel transistors, said second P-channel transistors and said second N-channel transistors forming a second functional block;
   a first dielectric contact etch stop layer formed in said first device region, said first dielectric contact etch stop layer comprising a plurality of first portions having a first intrinsic stress value and a plurality of second portions having a second intrinsic stress value other than said first intrinsic stress value, said first portions of said first dielectric layer being formed above said first P-channel transistors and said second portions of said first dielectric layer being formed above said first N-channel transistors; and
   a second dielectric contact etch stop layer formed in said second device region, said second dielectric contact etch stop layer comprising a plurality of first portions of said second dielectric layer having said first intrinsic stress value and a plurality of second portions of said second dielectric layer having a third intrinsic stress value other than said first and second intrinsic stress values, said first portions of said second dielectric layer being formed above said second P-channel transistors and said second portions of said second dielectric being formed above said second N-channel transistors.

2. The semiconductor device of claim 1, wherein said first functional block represents a logic circuit and said second functional block represents a memory block.

3. The semiconductor device of claim 2, wherein said memory block comprises a cache memory.

4. The semiconductor device of claim 1, wherein said first intrinsic stress is compressive and said second intrinsic stress is tensile.

5. The semiconductor device of claim 1, wherein an absolute amount of said third intrinsic stress value is less than absolute amounts of said first and second intrinsic stress values.

* * * * *